US011425842B2

(12) United States Patent
Nguyen

(10) Patent No.: US 11,425,842 B2
(45) Date of Patent: Aug. 23, 2022

(54) THERMAL DESIGN OF AN ACCESS POINT

(71) Applicant: HEWLETT PACKARD ENTERPRISE DEVELOPMENT LP, Houston, TX (US)

(72) Inventor: Tri Luong Nguyen, Santa Clara, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 17/020,566

(22) Filed: Sep. 14, 2020

(65) Prior Publication Data

US 2022/0087065 A1      Mar. 17, 2022

(51) Int. Cl.
| | |
|---|---|
| *H05K 7/20* | (2006.01) |
| *F28D 15/02* | (2006.01) |
| *H04W 88/08* | (2009.01) |

(52) U.S. Cl.
CPC ..... *H05K 7/20336* (2013.01); *F28D 15/0275* (2013.01); *H05K 7/20409* (2013.01); *H04W 88/08* (2013.01)

(58) Field of Classification Search
CPC ............ H05K 7/20336; H05K 7/20409; F28D 15/0275; H04W 88/08
USPC ................................................. 361/700, 701
See application file for complete search history.

(56) References Cited

U.S. PATENT DOCUMENTS

| | | | | |
|---|---|---|---|---|
| 5,424,913 A | * | 6/1995 | Swindler | G06F 1/203 |
| | | | | 361/679.47 |
| 5,946,192 A | * | 8/1999 | Ishigami | H05K 7/20418 |
| | | | | 361/704 |
| 6,360,813 B1 | | 3/2002 | Katoh et al. | |
| 6,365,964 B1 | * | 4/2002 | Koors | H01L 23/3675 |
| | | | | 257/707 |
| 6,408,935 B1 | * | 6/2002 | DeHoff | H01L 23/3737 |
| | | | | 165/104.33 |
| 6,434,001 B1 | * | 8/2002 | Bhatia | G06F 1/1632 |
| | | | | 165/104.14 |

(Continued)

FOREIGN PATENT DOCUMENTS

| | | | | | |
|---|---|---|---|---|---|
| CN | 100458343 C | * | 2/2009 | ......... | H01L 23/3677 |
| CN | 106658233 A | | 5/2017 | | |
| CN | 210629730 U | | 5/2020 | | |

OTHER PUBLICATIONS

RD-611079-A, Mar. 2015, RD.*

(Continued)

*Primary Examiner* — Anatoly Vortman
(74) *Attorney, Agent, or Firm* — Nolte Lackenbach Siegl

(57) ABSTRACT

A cooling apparatus is disclosed for cooling an electronic device, the apparatus including a conductive mounting bracket to couple with an electronic device housing and a heat sink integrated with the conductive mounting bracket. The cooling apparatus further includes a heat pipe coupled with the conductive mounting bracket on a first side of the heat pipe, the heat pipe to be directly coupled with a targeted electronic component within the electronic device, on a second side of the heat pipe. The apparatus may further include a conductive mounting interface attached to the electronic device housing to attach to the conductive mounting bracket. A mounting receptacle deployed within the conductive mounting interface may be used to expose the targeted electronic component.

9 Claims, 7 Drawing Sheets

(56) References Cited

U.S. PATENT DOCUMENTS

| | | | |
|---|---|---|---|
| 6,788,537 B2 | 9/2004 | Saita et al. | |
| 7,254,034 B2* | 8/2007 | Bolle | H05K 7/20436 165/185 |
| 7,414,850 B2* | 8/2008 | Hung | H01L 23/4093 165/185 |
| 7,542,293 B2* | 6/2009 | Zhao | H01L 23/427 361/700 |
| 8,125,783 B2* | 2/2012 | Tanaka | H01L 23/427 361/720 |
| 8,247,698 B2* | 8/2012 | Hwang | H01L 23/4093 174/252 |
| 8,373,990 B2* | 2/2013 | Jarmany | H05K 7/20445 361/707 |
| 8,462,508 B2* | 6/2013 | Lankston, II | F28D 15/0233 361/700 |
| 8,693,196 B2* | 4/2014 | Wu | G06F 1/182 361/698 |
| 8,804,336 B2* | 8/2014 | Lee | F28D 15/0275 361/700 |
| 8,976,528 B2* | 3/2015 | Degner | F28D 15/0275 361/707 |
| 9,754,857 B2* | 9/2017 | Tracy | G06F 1/20 |
| 10,001,140 B2* | 6/2018 | Chen | F04D 29/582 |
| 10,533,703 B1* | 1/2020 | Nguyen | F16M 13/027 |
| 10,691,184 B1 | 6/2020 | Ganta Papa Rao Bala et al. | |
| 2004/0184238 A1* | 9/2004 | Yang | F16B 5/0266 361/704 |
| 2004/0188080 A1* | 9/2004 | Gailus | F28D 15/0275 165/185 |
| 2004/0201958 A1* | 10/2004 | Lev | H01L 23/427 361/679.47 |
| 2005/0045310 A1* | 3/2005 | Okutsu | H01L 23/467 165/80.3 |
| 2006/0260787 A1* | 11/2006 | Wu | H01L 23/4006 165/104.33 |
| 2007/0058347 A1* | 3/2007 | Tsai | F28D 15/0275 361/703 |
| 2007/0272395 A1* | 11/2007 | Hwang | H01L 23/427 165/104.33 |
| 2008/0043438 A1* | 2/2008 | Refai-Ahmed | F28D 15/0233 361/700 |
| 2008/0156460 A1* | 7/2008 | Hwang | H01L 23/4006 165/80.3 |
| 2009/0044927 A1* | 2/2009 | Hwang | G06F 1/203 165/80.3 |
| 2010/0020501 A1* | 1/2010 | Li | H01L 23/427 361/710 |
| 2011/0114295 A1* | 5/2011 | Chiu | F28D 15/0233 165/104.26 |
| 2011/0168358 A1* | 7/2011 | Wu | F28D 15/0266 165/104.26 |
| 2011/0249401 A1 | 10/2011 | Yamaguchi | |
| 2011/0315352 A1* | 12/2011 | Lin | F28D 15/0233 165/104.26 |
| 2012/0160456 A1* | 6/2012 | Aoki | H01L 23/4006 165/104.26 |
| 2013/0118717 A1* | 5/2013 | Lin | F28D 15/0233 165/104.26 |
| 2013/0120937 A1* | 5/2013 | Liao | F28D 15/0275 361/700 |
| 2013/0329357 A1* | 12/2013 | Degner | G06F 1/203 361/679.47 |
| 2014/0144610 A1* | 5/2014 | Lin | F28F 1/24 165/121 |
| 2015/0192971 A1* | 7/2015 | Shah | G06F 1/1658 361/679.41 |
| 2015/0262907 A1* | 9/2015 | Degner | H05K 1/181 361/679.47 |
| 2015/0330716 A1* | 11/2015 | Chen | F28D 15/0275 165/104.26 |
| 2017/0016456 A1* | 1/2017 | Chen | F04D 29/582 |
| 2019/0364695 A1 | 11/2019 | Lee et al. | |

OTHER PUBLICATIONS

Advance Cooling Technologies, "Heat Pipes for Thermal Management", available online at <https://web.archive.org/web/20200817191312/https://www.1-act.com/innovations/heat-pipes/>, Aug. 17, 2020, 11 pages.

BOYD Corp., "Heat Pipe Technology", available online at <https://www.boydcorp.com/resources/temperature-control/heat-pipe-technology.html>, retrieved on Oct. 7, 2020, 5 pages.

Celsia Inc., "Heat Pipe Heat Sink Comparison", available online at <https://web.archive.org/web/20200520073505/https://celsiainc.com/heat-sink-blog/heat-pipe-heat-sink-comparison/>, May 20, 2020, 12 pages.

\* cited by examiner

THERMAL DESIGN OF AN ACCESS POINT

BACKGROUND

Computer systems include electronic components and circuits, such as central processing units (CPU) and memory modules, which consume electrical power to operate. The electrical power consumed by these circuits eventually is given off as heat. In high density systems having many circuits in a relatively small space, the heat density increases. Cooling a computer system may be necessary for its electronic components to operate and may increase the computer system's performance and/or extend its useful life.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
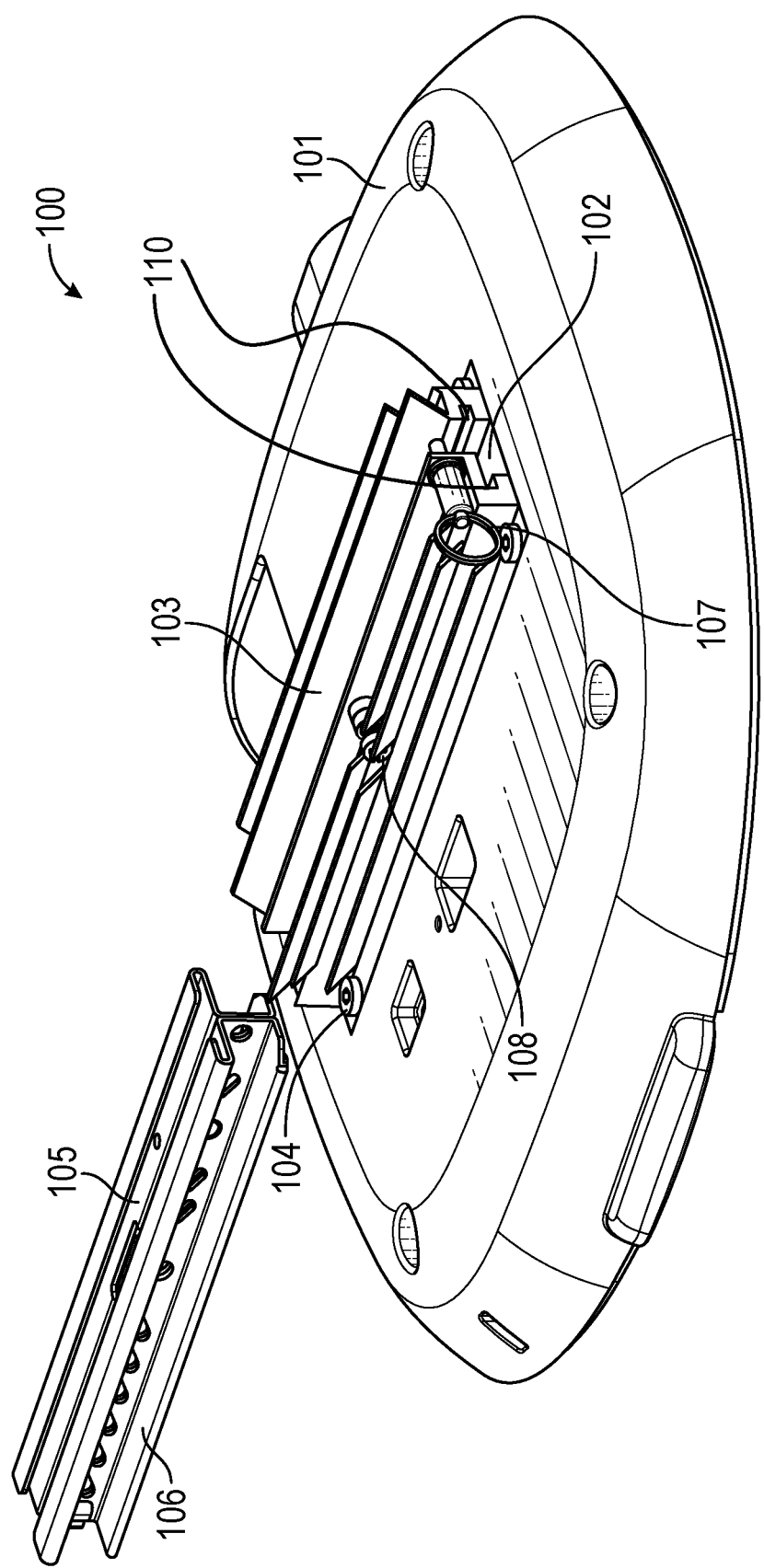
FIG. 1A shows an example configuration of an access point (AP) device (only back cover is shown for clarity) with a mounting bracket and integrated heat sinks.

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

A system and method are disclosed to cool electronic circuits, and in particular an access point (AP) device (for example, a WiFi™ 6E Access Point), using a geometrically adapted heat pipe integrated with a mounting bracket and heat exchanger fins. The heat pipe is adapted to be thermally and directly coupled with a specifically targeted high-heat generation electronic component, such as a processor, to focus cooling on the targeted component, in contrast to the whole circuit or circuit housing. WiFi 6E is the industry standard and recognized name for referencing. WiFi wireless communication protocol (see "wi-fi.org") that operates at about a 6 Giga Hertz (GHZ) frequency.

Further, as used herein, the article "a" is intended to have its ordinary meaning in the patent arts, namely "one or more." Herein, the terms "about" and "approximately" when applied to a value generally means within the tolerance range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. The term "coupled," as used herein, is defined as connected, whether directly without any intervening elements or indirectly with at least one intervening element, unless otherwise indicated. Two elements may be coupled mechanically, electrically, thermally, or communicatively linked through a communication channel, pathway, network, or system. The term "and/or" as used herein refers to and encompasses any and all possible combinations of the associated listed items. Moreover, examples herein are intended to be illustrative only and are presented for discussion purposes and not by way of limitation.

To cool electronic circuits and components, such as AP devices and their electronic components like general application CPU or specialized processors, different approaches may be used. Generally, there are three modes of heat transfer: conduction, convection, and radiation. These three modes, which may occur simultaneously, may be used to heat or cool a physical body, depending on whether heat is added to or removed from the body, respectively. Conduction is a mode of heat transfer that occurs by physical contact between two bodies at different temperatures. In convection, direct physical contact is not necessary but a working fluid, such as air or water, may be used to carry thermal energy to or from a body to be heated or cooled, respectively. Radiation occurs by emanation of electromagnetic waves carrying energy and does not depend on physical contact or a working fluid. Electrical and electronic systems, circuits, and components are often cooled using conduction, convection, radiation, or all three, as practical methods with sufficient heat removal capacity.

Convection is sometimes insufficient for cooling an electrical device or circuit, such as an AP device, if the heat density, defined as generation and/or flow of thermal energy per unit area per unit time, is high enough. When heat density passes a particular value or threshold, depending on the physical arrangement and spaces involved, convection by forced air may not remove sufficient heat to effectively cool the system and its components. Additionally, some devices, such as embedded computers or circuits, may be sealed with no air inlet or outlet to allow convection. In such situations, conduction may be a more effective choice for cooling the circuits. Furthermore, conduction may be more specifically applied to a targeted component, such as a CPU, than blown air, via physical routing of heat conducting material such as heat pipes and metal surfaces, thus, cooling the areas most in need of heat removal. Additional constraints, such as acoustic noise level, may apply to indoor circuits, such as AP devices, which may be deployed in working offices. In some configurations, a combination of conduction and convection may be used to remove heat at a higher time-rate (more heat removed per unit time). For example, heat may be removed by conduction into a heat pipe, and be carried away by the heat pipe via convection. This is further described below.

A cooling apparatus (see FIG. 6) is disclosed including a conductive mounting bracket to couple with a circuit housing and a heat sink integrated with the conductive mounting bracket. The cooling apparatus further includes a heat pipe coupled with the conductive mounting bracket on a first side of the heat pipe, the heat pipe to be directly coupled with a targeted electronic component on a second side of the heat pipe.

Further disclosed is an electronic circuit mounting bracket assembly including a conductive mounting bracket to install an electronic device on a structure, and a conductive mounting interface attached to a housing enclosing the electronic device to attach to the conductive mounting bracket. The mounting bracket assembly further includes a heat sink integrated with the conductive mounting bracket and a mounting receptacle deployed within the conductive mounting interface to expose a targeted electronic component to be cooled.

Still further, a method of cooling an electronic component is disclosed, the method including coupling a first side of a heat pipe to the electronic component via a thermal pad and coupling a second side of the heat pipe to a conductive mounting bracket. The method further includes removing heat from the electronic component at a heat intake section of the heat pipe, and dissipating heat at a heat outlet section of the heat pipe.

Now with reference to the figures, FIG. 1A shows an example configuration 100 of an access point (AP) device with a mounting bracket with integrated heat sinks. The configuration 100 includes an AP device 101 coupled with a mounting bracket 102 having integrated cooling fins 103, via screws or other kinds of fasteners 104. The mounting bracket 102 is configured to be coupled with mounting rails 105 and 106 using spring loaded pull pin 107 and fasteners 108. The configuration 100 also includes a heat pipe 201 (see FIG. 2), not shown in this figure.

AP device 101 may engage in any network data transmission operations, including, but not limited to, switching, routing, bridging, or a combination thereof. In examples described herein, an "access point" or "AP" generally refers to receiving points for any known or convenient wireless access technology which may later become known. Specifically, the term AP is not intended to be limited to APs which conform to IEEE 802.11 standards. AP device 101 generally functions as an electronic device that is adapted to allow wireless devices to connect to a wired network via various communications standards.

The mounting bracket 102 and cooling fins 103 may be fabricated from highly thermally-conductive material such as aluminum, copper, and the like. Other heat conducting material such as various polymers and suitable plastics or other synthetic materials may also be used for this purpose, subject to cost, material strength, and manufacturing constraints. The integrated cooling fins 103 may be manufactured as part of the mounting bracket 102 as one piece, or may be made separately and attached by screws, welding, or other suitable methods.

In some example implementations, the AP device 101 may have a housing, which may include a front section and a rear section (see FIG. 5; the front section is not shown for clarity) that enclose the electronic circuits and components of the AP device 101, such as radio transceivers, CPU, memory, registers, power supply, and other analog and digital circuits and components. The housing of the AP device may be generally made of any material including electrically non-conducting material.

The mounting rails 105 and 106 may be adapted to be coupled with the mounting bracket via slots 110 built into the mounting bracket 102 that receive the mounting rails 105 and 106. The mounting rails 105 and 106 may be fastened or locked into the mounting bracket 102 using spring-loaded fasteners, such as plungers, or other methods of attachment such as screws or nuts and bolts.

Figure 1B:
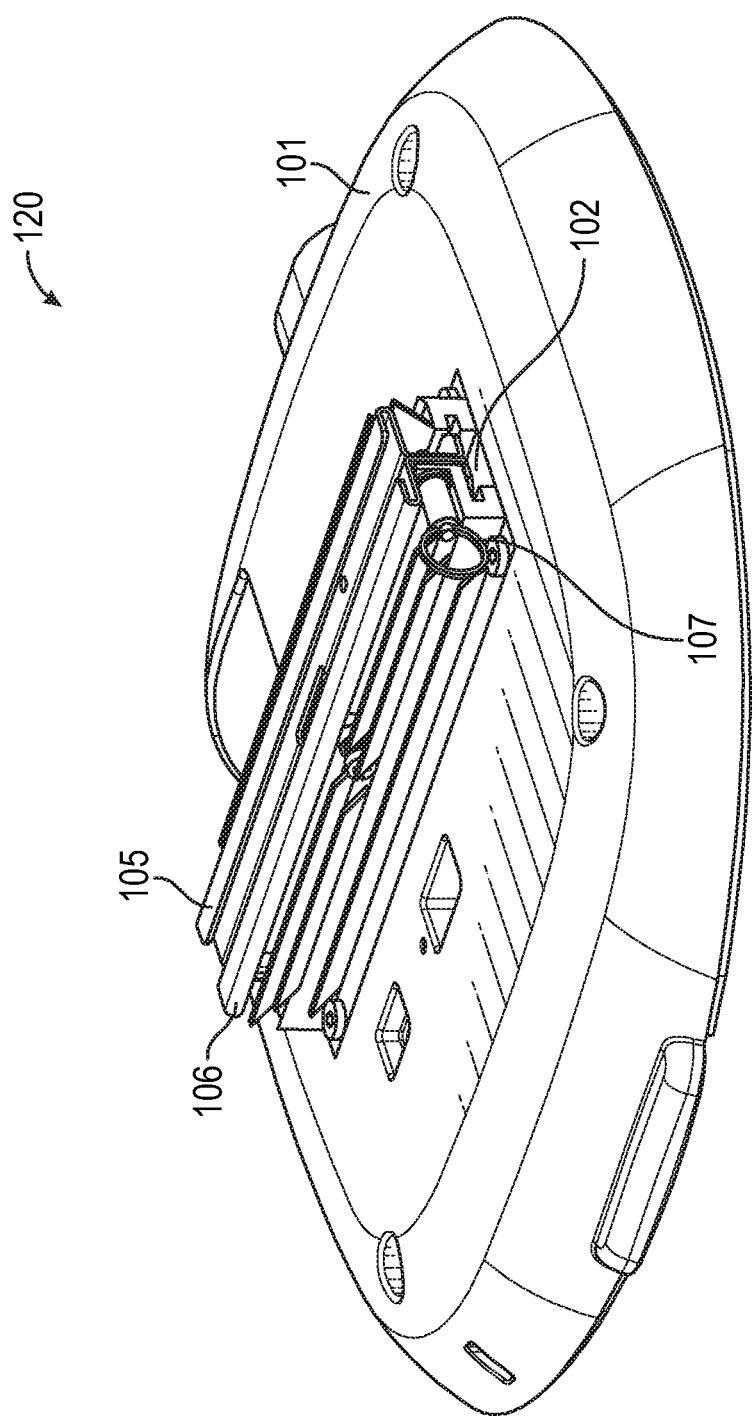
FIG. 1B shows the example configuration AP device of FIG. 1 with mounting rails attached to the mounting bracket.

FIG. 1B shows the example configuration 120 AP device of FIG. 1 with mounting rails attached to the mounting bracket. The configuration 120 is similar to the configuration 100, but with the mounting rails 105 and 106 attached to the mounting bracket 102.

The mounting rails 105 and 106 may be used to attach the AP device as a whole unit to a ceiling, wall, door, column or other structural feature of a building to serve devices that access the internet via the AP device in close proximity (for example, within approximately 150-300 feet). In some example implementations, the mounting rails 105 and 106 may attach to the mounting bracket 102 by sliding into slots 110 deployed within the mounting bracket 102 for this purpose.

The mounting bracket 102 is integrated (made as one piece or attached) with cooling fins 103 to form a dual purpose bracket that is used to mount and also to cool the AP device 101. The modular design of the mounting bracket 102 and how it may be attached to the housing of the AP device 101, as further described below, reduces cost while also improving the cooling performance and efficiency. The reduction of cost and effective cooling becomes more desirable when the amount of heat generated by particular high-power-consumption electrical components, such as a CPU, increases. Generally, the higher performance components that operate at relatively higher frequencies consume more electrical power, as is the case for AP WiFi 6E devices.

As used herein, the term "thermally conductive" as applied to a material refers to measurable physical properties of that material that affect transfer of heat through the material. An object, device, or assembly (which may comprise multiple distinct bodies that are thermally coupled, and may include multiple different materials), is "thermally conductive" if its thermal conductivity is at least 1 W/m·K. Thermal pad elastomers may have a thermal conductivity from 1 W/m·K to 12 W/m·K and be considered thermally conductive. Air's thermal conductivity may have a value of 0.02 W/m·K and may be considered not thermally conductive. A highly thermally conductive material may have a thermal conductivity of greater than about 150 W/m·K. In some applications, relative thermal conductivity, or the difference between the respective thermal conductivity of two alternative materials (for example, steel versus aluminum) may be of more interest. While in some other applications, the absolute value of the thermal conductivity may be of more interest. For example, if an improvement is sought in a cooling system, then the improvement may be achieved by using a more thermally conductive material than what is currently used, such as using aluminum instead of steel for a heat sink. But if a specific amount of heat is to be removed or transferred from a hot body at a certain rate, then the absolute value of the thermal conductivity of the material may have to be used to satisfy the design requirements.

As used herein, two items are "thermally coupled" if: (1) they are in contact with one another, or (2) they are both in contact with a thermally conductive thermal transfer device (or thermally conductive chain of thermally coupled thermal transfer devices), or (3) a heat transfer coefficient between the two items is about 10 W/m²·K or greater at any temperature between 0° C. and 100° C.

Figure 2:
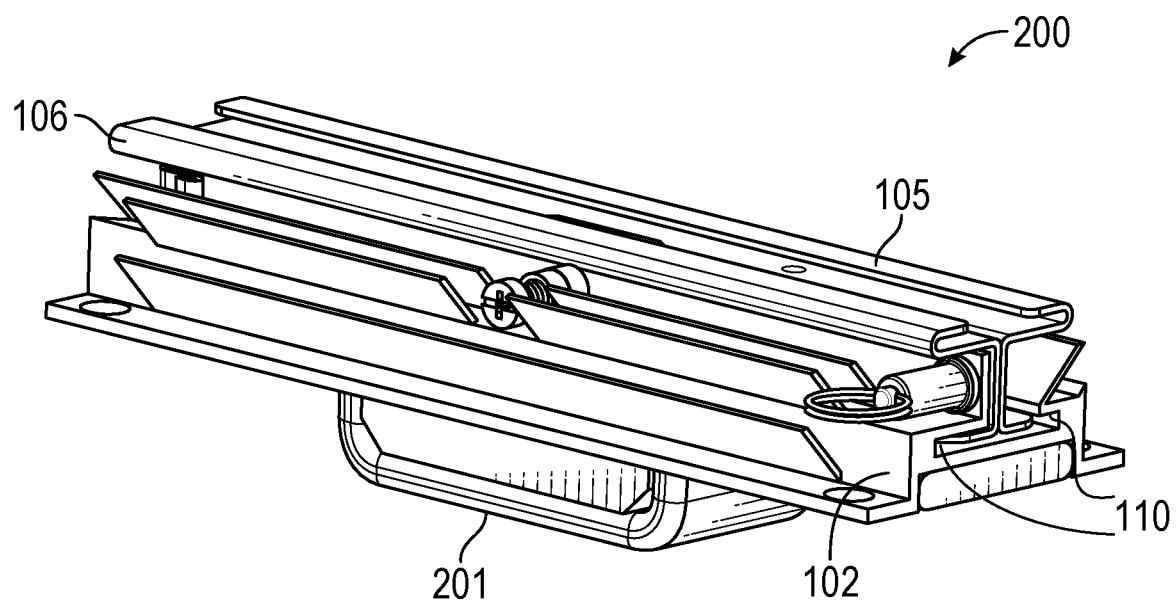
FIG. 2 shows a configuration in which the example mounting bracket and mounting rails of FIG. 1B are integrated with a heat pipe.

FIG. 2 shows a configuration 200 in which the example mounting bracket and mounting rails of FIG. 1B are integrated with a heat pipe. The configuration 200 includes all elements of configuration 120, namely, mounting bracket 102 and mounting rails 105 and 106. In addition, it includes a heat pipe 201 that is attached to the mounting bracket 102 for better heat transfer and removal. As noted earlier and as will be discussed further below, the heat pipe 201 is visually obscured in FIG. 1A and FIG. 1B by the housing of the AP device 101.

The heat pipe 201 may be geometrically adapted to increase and/or maximize heat transfer, via conduction, from the housing of the AP device 101 to the heat pipe 201. The geometric adaptation may take the form of one or two flattened sides of the heat pipe 201, each flattened side attaching to one object for heat transfer to or from the object. For a given physical size of the heat pipe 201, heat transfer to and from the heat pipe 201 may be facilitated by maximizing the contact area between the heat pipe 201 and the object to/from which heat is being transferred. Whatever surface shape the object which the heat pipe 201 is contacting has, taking the same surface shape by the side of the heat pipe 201 maximizes the contact area. For example, if the surface shape of the AP device housing is flat, then a flat heat pipe maximizes the contact between the two surfaces. In another example, if the surface of the AP device is curved, then a heat pipe with a curved surface maximizes the contact between the two surfaces. Surface contact maximization is further described with respect to other figures. As an example, the heat pipe 201 may be geometrically adapted to increase and/or maximize heat transfer, via conduction, from the electrical components inside the housing of the AP device 101 to the heat pipe 201. The flat and straight heat pipe 201 may be bent into different profiles to conform to the placement of electronic components inside the housing of the AP device 101. The number of bends of the heat pipe 201 is kept to a minimum to increase and/or optimize the heat transfer rate. In some examples, the profile of the bottom part of the heat sink is to match that of the heat pipe to provide structural support and to maximize contact between the two for better heat transfer. Two surfaces match when they have the same or close geometric shape and dimensions within acceptable tolerances. An acceptable tolerance in manufacturing is dependent upon the application and size of the parts and may range from a few thousandths of an inch to a few tens of thousandths of an inch (for example, 0.001"-0.01"), or less or more. A dimensionally smaller surface may still be said to match a bigger surface if the shapes (curves, bends, contours, etc.) are similar.

In some example implementations, the mounting bracket 102 and the cooling fins 103 may have surface treatments such as black anodizing, black painting, or other color darkening treatments, to enhance radiation and allow the cooling apparatus 601 to facilitate more efficient heat dissipation.

Figure 3:
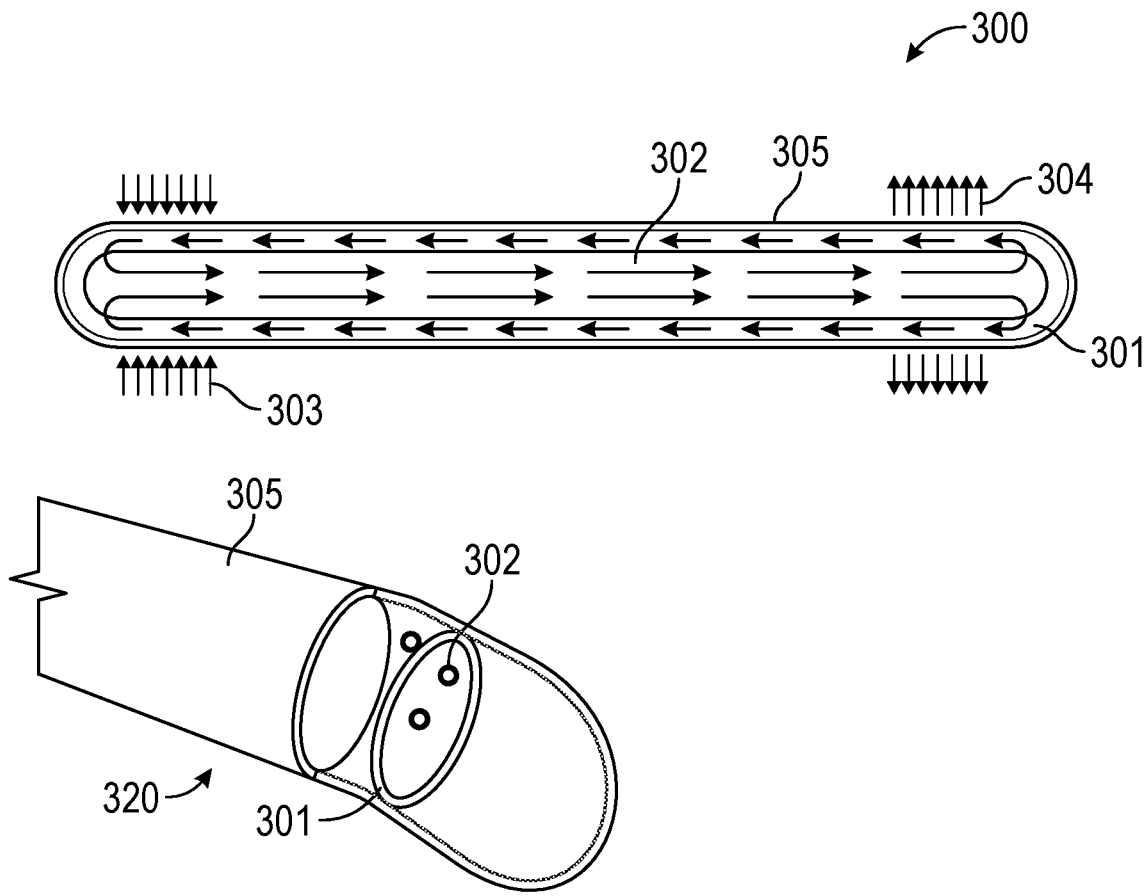
FIG. 3 shows an example heat pipe structure and its basic operation.

FIG. 3 shows an example heat pipe structure 300 and its basic operation. The heat pipe structure 300 includes a wick layer 301, an internal chamber 302 forming a pathway for flow of a working fluid vapor, a heat intake section 303, a heat exhaust or heat outlet section 304, and a sealed housing 305 containing the wick layer 301 and the internal chamber 302.

The internal details 320 of the heat pipe shows a perspective cross section of the heat pipe including the elements listed above: the wick layer 301, the internal chamber 302, and the housing 305 enclosing the wick layer 301 and the internal chamber 302.

Heat pipes operate internally based on passive convection and working fluid phase change. On the heat intake section 303 (where heat is transferred to the heat pipe), an internal working fluid is evaporated (phase change from liquid to vapor) and removes heat. An insulated adiabatic section (where no or little heat is transferred in or out), between the heat intake section 303 (hot section) and the heat outlet section 304 (cold section), may be utilized, which causes the expanding working fluid to move from the heat intake section 303 of the heat pipe to the heat outlet section 304 of the heat pipe. The heat outlet section 304 is generally located in a lower temperature environment to diffuse heat. The working fluid condenses (phase change from vapor to liquid) at the heat outlet section 304 and returns to the heat intake section 303 by capillary action of the wick layer along the internal walls of the heat pipe enclosing the internal chamber 302. Heat pipe structure 300 symbolically depicts the flow of heat and the movement of the working fluid by arrows, as indicated in the figure.

Figure 4:
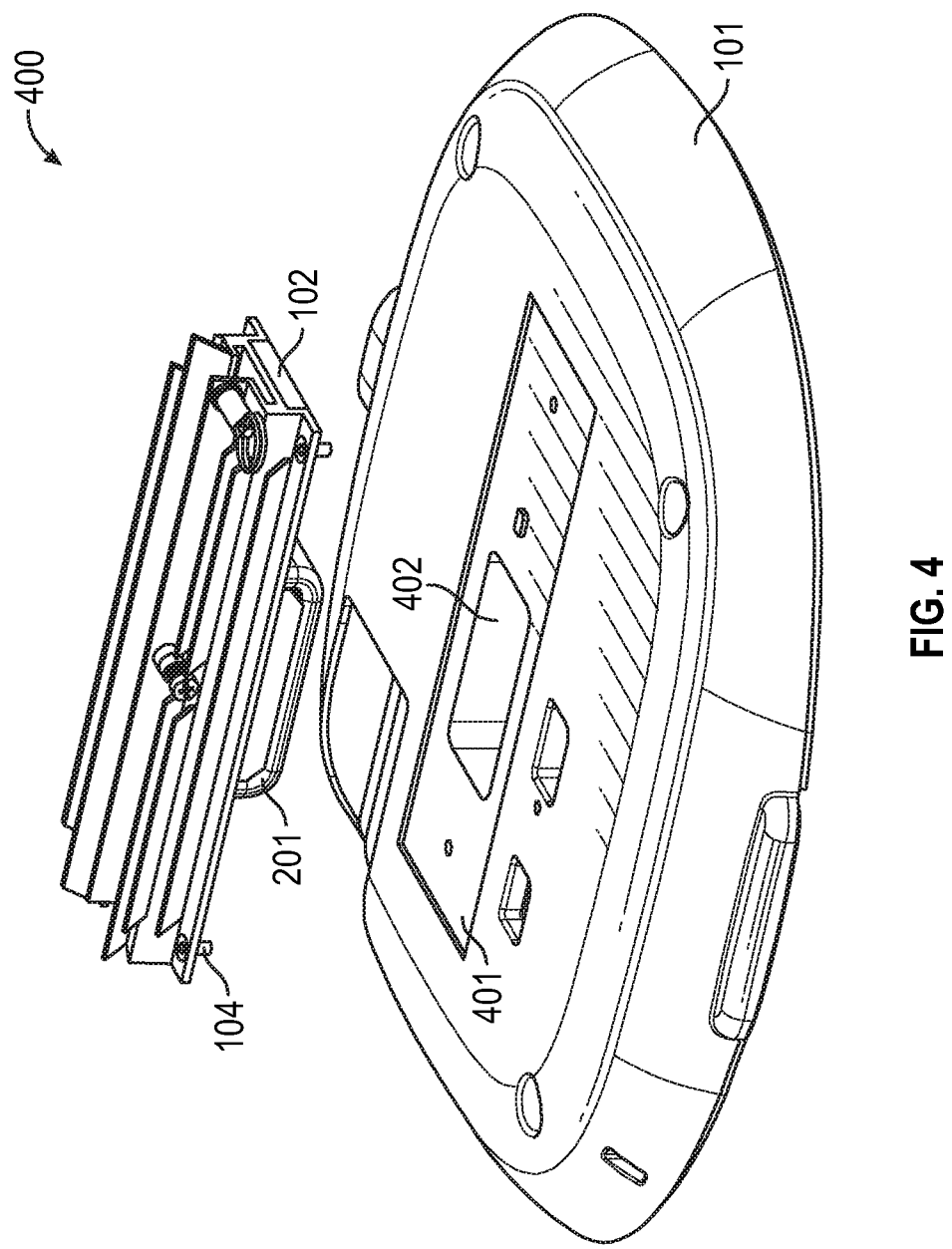
FIG. 4 shows an example configuration of an AP device with a mounting receptacle to receive the heat pipe of FIG. 2.

FIG. 4 shows an example configuration 400 of an AP device 101 with a mounting receptacle 402 to receive the heat pipe 201 of FIG. 2. Configuration 400 includes the AP device 101, the mounting bracket 102, the fasteners 104, the heat pipe 201, a mounting interface 401, and a mounting receptacle 402.

The mounting interface 401 may be integrated with the housing of AP device 101 and it may be made of a thermally conducting material, such as copper (thermal conductivity of about 400 W/m·K) or aluminum (thermal conductivity of about 235 W/m·K) or other suitable structural material. The mounting bracket 102 is coupled with the mounting interface using one or more of the fasteners 104. The mounting interface 401 may be omitted in some examples in which the mounting bracket 102 is attached directly to the exterior of the housing for the AP device 101.

The mounting receptacle 402 is made with dimensions designed to receive the heat pipe 201. Part of the heat pipe 201 is designed with the appropriate bends to partially sink into and be received by the mounting receptacle 402. For example, the heat pipe 201 may have a U-shaped section in the middle that fits within the receptacle 402, while the two ends surrounding the middle U-shaped section are located outside the receptacle 402, as shown in and further described with respect to FIG. 5 below.

Figure 5:
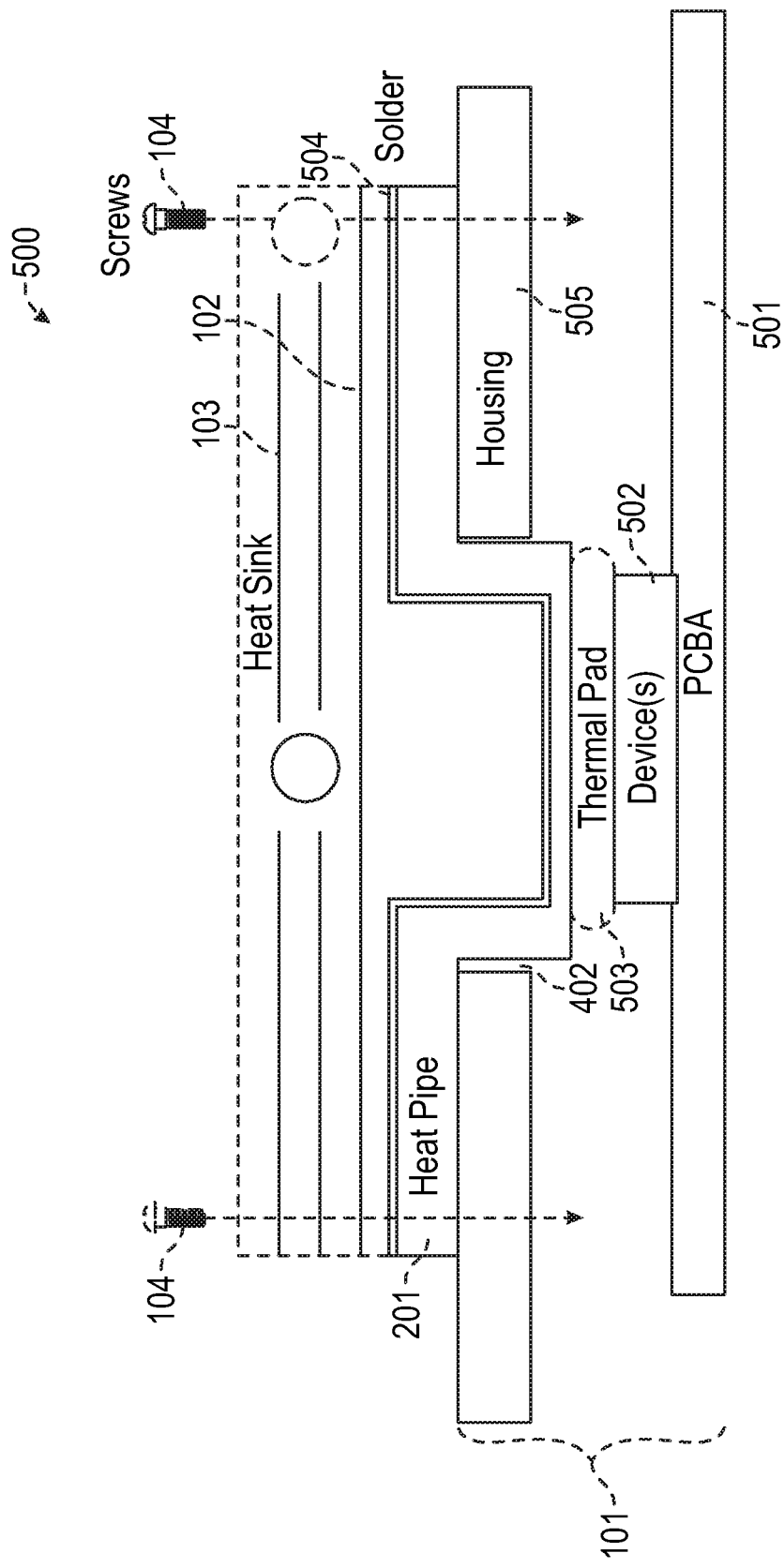
FIG. 5 shows the example configuration of the AP device of FIG. 4 with the heat pipe coupled with a targeted electrical component of the AP device.

FIG. 5 shows the example configuration 500 of the AP device of FIG. 4 with the heat pipe coupled with a targeted electrical component of the AP device 101. The configuration 500 includes the AP device 101 with housing 505, the heat sink or cooling fins 103 integrated with the mounting bracket 102, and fasteners 104 to couple the mounting bracket 102 with housing 505 of AP device 101. The heat pipe 201 is attached to the mounting bracket 102 using solder layer 504. A section of the heat pipe 201 is contained within the mounting receptacle 402 and touching a thermal pad 503. The thermal pad 503 is directly in touch with a target device 502 (targeted for cooling) installed on a printed circuit board assembly (PCBA) 501.

The heat sink or cooling fins 103 may take different shapes and be made of various suitable heat conducting material that can maximize heat transfer between the cooling fins 103 and air where the heat is ultimately dissipated. Generally, to maximize heat transfer, fin geometric shapes and configurations are selected to maximize the surface areas of the cooling fins 103, while keeping the fins far away enough from each other to allow effective cooling and air circulation around the fins. If the fins are too close to each other, then air circulation and heat exchange is restricted, thereby reducing heat exchange and cooling.

The fasteners 104 may be of any suitable type and any suitable number. For example, four screws may be used in the four corners of the mounting bracket 102. Alternatively, one or two fasteners may be used on one side of the mounting bracket 102 while the other side of the mounting bracket 102 may be anchored by a quick-release hook or other common methods used on mechanical mounts.

In some example implementations, heat pipe 201 may be attached to the mounting bracket 102 using solder, brazing, heat conducting epoxy adhesives, or other suitable methods that allows firm and complete surface contact between the heat pipe 201 side and the mounting bracket 102. The complete surface contact allows better and more heat transfer between the two surfaces attached, than partial surface contact, although partial surface contact may suffice in some examples. Soldering, brazing and other similar methods of attachment reduce thermal resistance and allow better and/or faster heat transfer.

Heat pipe 201 wall shape may be designed to follow the same contour as the housing 505 of the AP device 101 and/or the mounting bracket 102 for attachment. This contour matching allows more complete surface and thermal contact and thus more complete and better and/or faster heat transfer between the surfaces compared to non-matched surface shapes, which may have some separation at some points on the attached surfaces. In some example implementations, the housing 305 of heat pipe 201 may be made from a non-flexible rigid material, such as copper, that is manufactured to match the contour of the surface it is attached to. For example, the heat pipe 201 shape may be manufactured to fit withing the mounting receptacle 402 (see FIG. 4) even if it has a rigid housing 305. In an example implementation, the heat pipe 201 may be constructed to follow the contours of the mounting interface 401, including the contours of the mounting receptacle 402, like a staircase as shown in FIG. 5.

In some example implementations, multiple heat pipes may be used that work in parallel, while in other example implementations, one larger heat pipe may be used with equal heat removal capacity as the multiple heat pipes. In the latter implementation, the cost and complexity of the heat pipe may be reduced, while the efficiency and performance of heat removal may be increased. This is because, for instance, it may cost less to manufacture one larger heat pipe than multiple smaller heat pipes for the same heat removal capacity. Also, the contact surface between the heat pipe and the surface it is attached to may be larger when using one larger heat pipe than using multiple smaller heat pipes, hence increasing heat removal efficiency based on a given/desired total heat transfer/removal capacity. Additionally, a larger heat pipe may have smaller internal pressure and resistance for the flow of the working fluid, which results in more free flow of the working fluid and thus more heat transfer.

The mounting receptacle 402 (see FIG. 4) may be generally designed to expose a high-power-consumption and/or high heat generation electrical component or target device 502, such as a CPU, so that heat pipe 201 may be placed in direct contact with the target device 502, usually using a thermal pad or thermal paste for good and complete contact for better and/or faster (higher rate) heat transfer. In some example implementations, the circuit to be cooled, for example the AP device 101, may include several high heat generation components that need to be cooled. In such cases, multiple mounting receptacles 402 may be deployed withing the housing of the AP device 101 to expose the components that need cooling. Accordingly, the heat pipe 201 may have a corresponding shape to fit into multiple receptacles. Alternatively, multiple heat pipes may be used, one for each of the multiple mounting receptacles.

The thermal pad 503 may be a compliant thermal elastomer, or other thermal interface material such as thermal paste, that is suitable for rapid and efficient heat transfer between the target device 502 and the heat pipe 201.

The configuration 500 shows a cross section of the cooling apparatus and how all components are related to each other, in one particular example. The cooling apparatus (similar to cooling apparatus 601 of FIG. 6) or assembly including the mounting bracket 102, the integrated cooling fins 103, the heat pipe 201, the mounting interface 401 with the mounting receptacle 402 form a modular mounting bracket and cooling assembly that may be manufactured separately from the AP device housing 505. This arrangement allows the mounting bracket and cooling assembly to be made from suitable heat-conducting material, such as aluminum, copper, and the like, different from the material used to make the AP device housing 505, which may be made from a non-conducting material, such as plastics which may be molded to accommodate and match the internal structure and components of the AP device 101. The overall size and cost of the AP device 101 and the mounting bracket 102 may also be reduced because of the efficient heat removal allowed by a large flat-sided heat pipe 201 that allows good and complete thermal contact for heat transfer.

In operation, the heat generated by the electrical target device 502 during operation is transferred to the heat pipe 201 via the thermal pad 503. The heat pipe, by its normal thermally phase change operation, described above with respect to FIG. 3, transfers the heat from its hot section, which, in some configurations like that shown in FIG. 5, may be located in the middle of the heat pipe 201, to its cold sections at the opposite ends of the heat pipe 201. The cold sections of the heat pipe 201 then transfer the heat, via the solder layer 504 to the mounting bracket 102. The heat is further transferred from the mounting bracket 102 to the cooling fins 103 to be exchanged with and distributed to the surrounding cooler air. Hence, using this passive cooling apparatus 601, the heat is directly and efficiently removed from a hot component at one end and dissipated through the cooling fins 103 at the other end. By using the combination of a single large flat-based (or contour-matched) heat pipe and high thermal conductivity material used in the bracket and cooling fins, it is estimated that a 28% improved performance in heat removal may be achieved, in at least some examples, compared with not using an integrated cooling fin, modular cooling assembly and a single larger flattened heat pipe.

Figure 6:
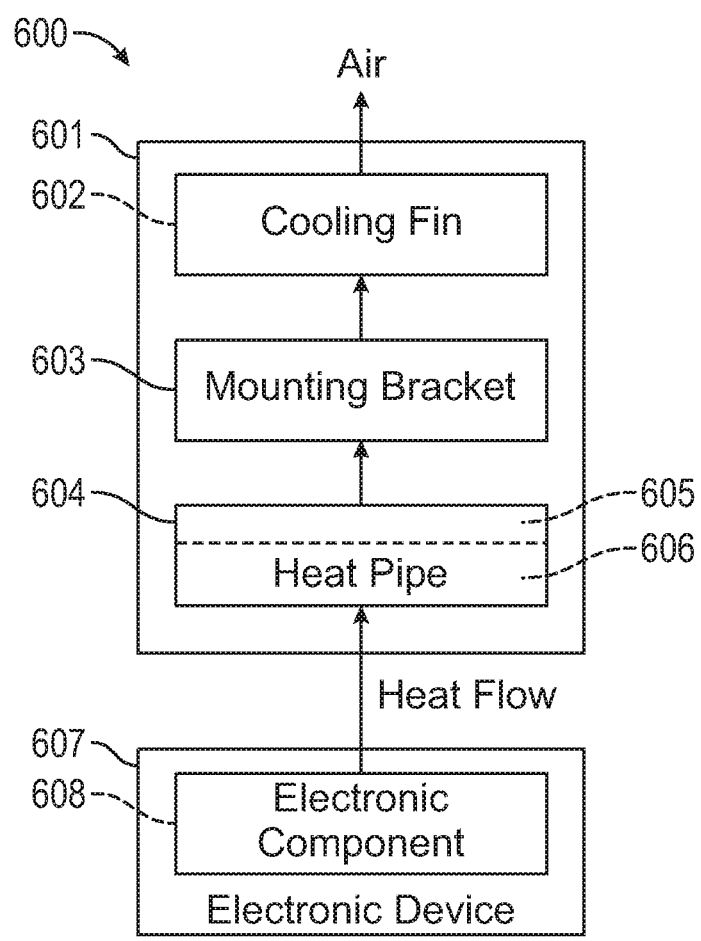
FIG. 6 shows an example block diagram of an electronic device cooling apparatus.

In light of the foregoing descriptions, FIG. 6 shows an example block diagram 600 of an electronic device cooling apparatus. This simplified block diagram representation of the cooling apparatus described herein may further clarify the relationships between various components of the cooling apparatus and its operation. In some example implementations, a cooling apparatus 601 may include a cooling fin 602 integrated with a mounting bracket 603, which in turn may be thermally and/or physically coupled to a heat pipe 604. The heat pipe 604 may have a first surface or first side 605 and a second surface or second side 606. The second side 606 may be configured to be thermally coupled with an electronic component 608 within an electronic device 607 to directly cool the electronic component 608. Examples of physical implementations of the cooling apparatus 601 is described below with respect to FIG. 2 and other figures.

In operation, the cooling apparatus 601 provides cooling directly to the electronic component 608, in contrast to cooling the whole electronic device 607 including the electronic component 608 contained therein. Generally, during operation, the electronic component 608 may be at a higher temperature relative to its environment, for example, the air surrounding the electronic device 607. The temperature difference between the higher temperature at the electronic component 608 and the second side 606 of the heat pipe 604 drives or transfers heat (thermal energy) from the electronic component 608 to the second side 606 of heat pipe 604. In the same manner heat is transferred from the heat pipe 604 to the mounting bracket 603 via the first side 605 of the heat pipe 604, from the mounting bracket 603 to the cooling fin 602, and finally from the cooling fin 602 to the ambient air.

Figure 7:
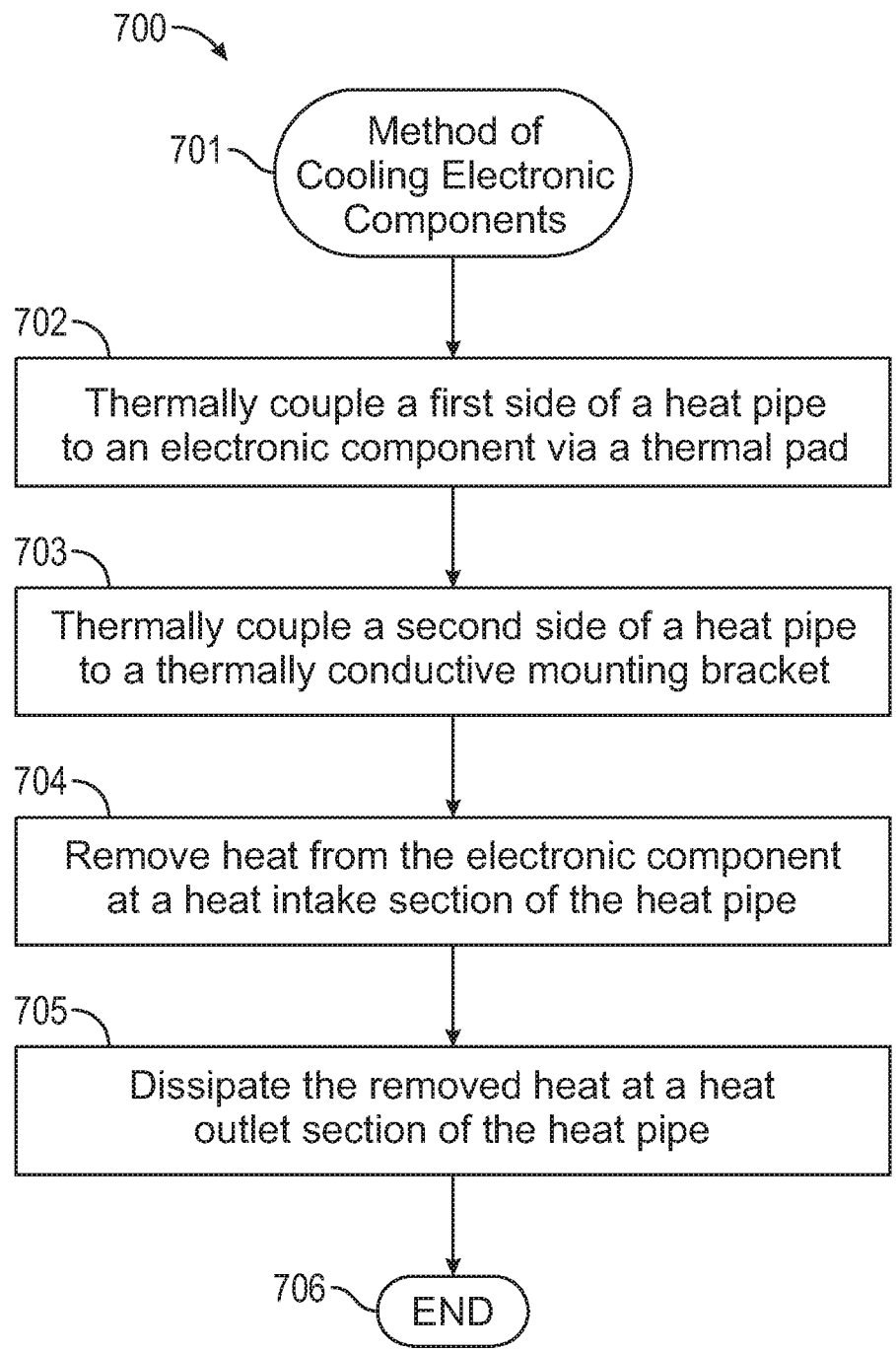
FIG. 7 shows an example flow diagram for a method of cooling an electronic component.

FIG. 7 shows an example flow diagram 700 for a method of cooling an electronic component. The process starts at block 701 and proceeds to block 702.

At block 702, thermally couple a first side of a heat pipe (see FIG. 6) to an electronic component via a thermal pad. Proceed to block 703.

At block 703, thermally couple a second side of the heat pipe to a thermally conductive mounting bracket. Proceed to block 704.

At block 704, remove heat from the electronic component at a heat intake section of the heat pipe (see FIG. 3). Proceed to block 705.

At block 705, dissipate the removed heat at a heat outlet section of the heat pipe. Proceed to block 706 and terminate the process.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

This concludes the detailed description. The particular examples and implementations disclosed above are illustrative only, as examples described herein may be modified and practiced in different but equivalent manners apparent to those skilled in the art having the benefit of the teachings herein. Furthermore, no limitations are intended to the details of construction or design herein shown, other than as described in the claims below. It is therefore evident that the particular examples disclosed above may be altered or modified and all such variations are considered within the scope and spirit of the appended claims. Accordingly, the protection sought herein is as set forth in the claims below.

What is claimed is:

1. A cooling apparatus comprising:
   a thermally conductive mounting bracket to couple with a housing of an electronic device, with a first side of the thermally conductive mounting bracket including a set of slots, wherein mounting rails are removably and slidingly attached to the mounting bracket via the set of slots to mount the said housing and the said mounting bracket of the electronic device to another structure;
   a heat sink integrated with the first side of the thermally conductive mounting bracket; and
   a heat pipe coupled with a second side of the thermally conductive mounting bracket on a first side of the heat pipe, the heat pipe to be coupled with a targeted electronic component on a second side of the heat pipe, wherein the first side and the second side are opposite to each other.

2. The cooling apparatus of claim 1, further comprising a solder layer deployed between the first side of the heat pipe and the second side of the thermally conductive mounting bracket.

3. The cooling apparatus of claim 1, further comprising a thermal pad deployed between the second side of the heat pipe and the targeted electronic component.

4. The cooling apparatus of claim 1, further comprising a thermally conductive mounting interface attached to a circuit housing, wherein the thermally conductive mounting interface is made from a material different from a material used to make the housing of the electronic device.

5. The cooling apparatus of claim 4, further comprising a mounting receptacle deployed within the thermally conductive mounting interface to expose the targeted electronic component and receive a portion of the heat pipe.

6. The cooling apparatus of claim 1, wherein the heat pipe side-walls are made to match a contour of the housing of the electronic device.

7. The cooling apparatus of claim 5, wherein the heat pipe is designed to fit within the mounting receptacle to make direct contact with the targeted electronic component.

8. The cooling apparatus of claim 5, wherein the heat pipe includes a heat intake middle section to absorb heat and two heat outlet end sections to dissipate heat.

9. The cooling apparatus of claim 5, wherein the housing of the electronic device encloses an access point (AP) circuit board.

\* \* \* \* \*